United States Patent
Van De Graaff

(10) Patent No.: US 6,756,815 B2
(45) Date of Patent: Jun. 29, 2004

(54) INPUT BUFFER WITH SELECTABLE OPERATIONAL CHARACTERISTICS

(75) Inventor: Scott Van De Graaff, Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 0 days.

(21) Appl. No.: 10/230,553

(22) Filed: Aug. 29, 2002

(65) Prior Publication Data

US 2004/0041586 A1 Mar. 4, 2004

(51) Int. Cl.$^7$ .............................................. H03K 19/175
(52) U.S. Cl. ........................ 326/82; 326/105; 326/86; 365/63; 365/189.05; 365/233
(58) Field of Search .............................. 326/82, 81, 86, 326/105; 365/63, 189.05, 233, 238.5

(56) References Cited

U.S. PATENT DOCUMENTS

| | | | |
|---|---|---|---|
| 6,420,899 B1 | * 7/2002 | Crittenden et al. | 326/30 |
| 6,437,597 B1 | * 8/2002 | Chan | 326/16 |
| 6,472,904 B2 | * 10/2002 | Andrews et al. | 326/38 |
| 6,496,403 B2 | * 12/2002 | Noda et al. | 365/63 |

* cited by examiner

*Primary Examiner*—Vibol Tan
(74) *Attorney, Agent, or Firm*—Fletcher Yoder

(57) ABSTRACT

The disclosed embodiments relate to an input buffer circuit. The input buffer circuit comprises a first input buffer having a first operational characteristic and a second input buffer having a second operational characteristic. The output of the first input buffer or the second input buffer is selected responsive to buffer selection input data.

46 Claims, 3 Drawing Sheets

INPUT BUFFER WITH SELECTABLE OPERATIONAL CHARACTERISTICS

BACKGROUND OF THE INVENTION

1. Field of the Invention

This present invention relates generally to the field of integrated circuit design and, more specifically, to an input buffer circuit that has operational characteristics that are selectable depending on the intended application.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Computer systems and other electronic devices typically include a variety of electrically interconnected integrated circuit (IC) packages which perform a variety of functions, including memory and processing functions. Many integrated circuit devices have input buffers, which receive data from outside of the integrated circuit. The input buffer is the first stop for data inside the integrated circuit before the data is stored or further processed. Typically, one input buffer is used for each data input of an integrated circuit.

There are two commonly used types of input buffers: (1) differential input buffers and (2) Complementary Metal Oxide Semiconductor (CMOS) input buffers. Each of these input buffer types has advantages and disadvantages compared to the other.

A differential input buffer is typically used to monitor the transitions of an input signal relative to a fixed reference voltage or relative to a compliment differential signal. The fixed reference voltage may be referred to as $V_{REF}$. The output of a differential input buffer may transition from a logical high ("1") to a logical low ("0") or vice versa as the input crosses the threshold established by the reference voltage $V_{REF}$. Differential input buffers typically offer higher performance (faster switching time) than CMOS buffers, but differential input buffers also tend to consume more power than CMOS input buffers. The high power consumption of differential input buffers is in part because differential input buffers have source voltages that are always present, even when the buffer is not in normal operation. These source voltages are partially dissipated by the internal circuitry of the differential buffer, which consumes power. Also, the reference voltage $V_{REF}$ is typically always connected to a differential input buffer, resulting in further power consumption.

CMOS input buffers are simpler than differential input buffers. CMOS input buffers do not require the connection of a reference voltage $V_{REF}$. Also, the internal circuitry of CMOS buffers does not consume power when the buffer is not in operation. As a result, CMOS buffers do not generally consume as much power as differential input buffers. A disadvantage of CMOS input buffers is that they do not typically offer performance levels in terms of switching speed associated with differential input buffers.

Power consumption and performance (operational speed) are two important factors in the design of integrated circuits. Accordingly, those factors are important in the design of input buffers, as well. The relationship between power consumption and performance is a classic design tradeoff. This means that an input buffer that is optimized for performance (high speed) typically consumes much more power than an input buffer designed to save power. Correspondingly, an input buffer that is designed to conserve power typically has slower performance characteristics compared to an input buffer that is designed for high performance.

As new designs for computer systems and other electronic devices continue to evolve and proliferate, designers of electronic devices are constantly faced with deciding what performance characteristics they need to incorporate in devices having different operational characteristics. For example, a small portable electronic device such as a cell phone or a personal digital assistant (PDA) may have reduced power consumption as a primary design goal. On the other hand, a high performance desktop computer system that is plugged into a source of AC power most of the time may have higher performance as a more important design goal than low power consumption.

Many computers and electronic devices employ volatile random access memory (RAM) to store information during normal operation. One examples of a type of RAM that is commonly used in a wide range of electronic devices is dynamic random access memory (DRAM), which must be continually updated or "refreshed" to preserve its contents. DRAM is typically used for the main memory of most computer systems. There are many different implementations and types of DRAM, including synchronous DRAM (SDRAM) and double data rate (DDR) SDRAM.

The power consumption and performance tradeoff discussed above is applicable to the choice of input buffers for the DRAM memory in a given electronic device design. This is true because DRAM can have a major impact on the overall power budget of an electronic device. Additionally, the performance of DRAM may have significant impact on the overall performance of an electronic device. In the past, designers of electronic devices may have had to choose a DRAM with CMOS input buffers for certain applications (e.g. low power consumption) and a different DRAM configuration or implementation with differential input buffers for other applications (e.g. higher performance). Specifically, a designer of a cell phone or other small electronic device may have chosen a DRAM with CMOS input buffers to meet a design requirement of low power consumption while a designer of a desktop computer system may have had to choose a different type of DRAM with differential input buffers to meet a design requirement of high system performance. A DRAM having operational characteristics that may be selected depending on the specific application is desirable.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
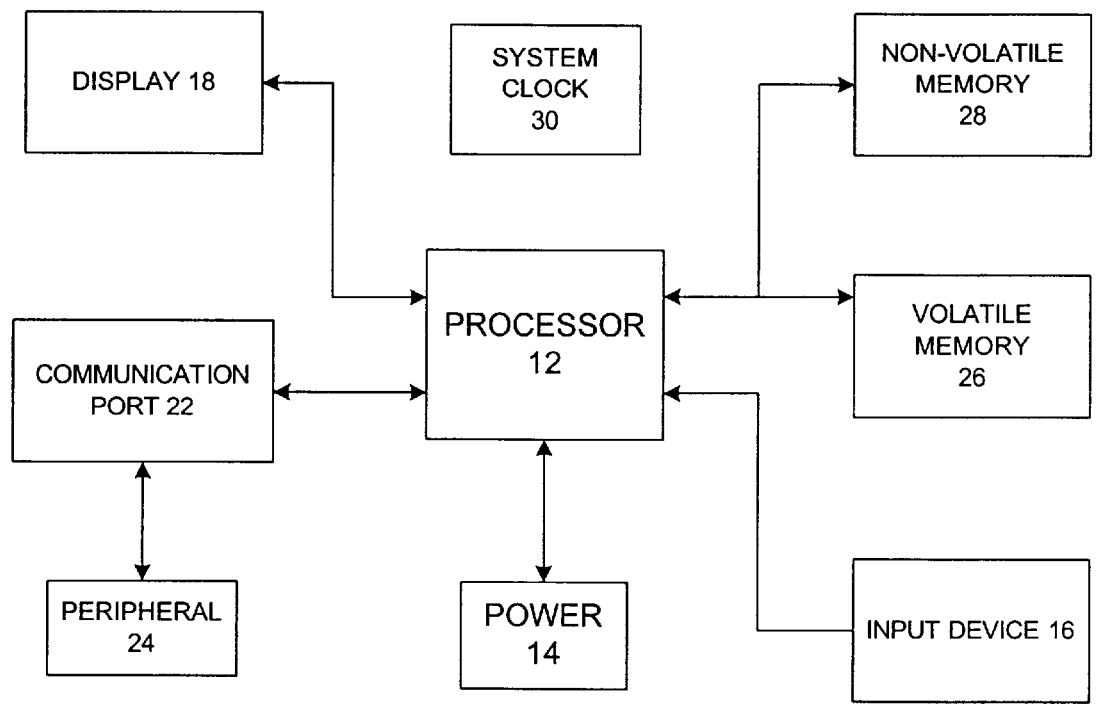
FIG. 1 is a block diagram of an electronic device containing integrated circuit devices that may employ embodiments of the present invention.

Turning now to the drawings, FIG. 1 is a block diagram depicting an exemplary processor-based electronic device, generally designated by the reference numeral 10. The device 10 may be any of a variety of different types, such as a computer, pager, cellular telephone, personal organizer, etc. In a typical processor-based device, a processor 12, such as a microprocessor, executes software to control the operation of the device 10.

The device 10 typically includes a power supply 14. For instance, if the device 10 is portable, the power supply 14 would advantageously include permanent batteries, replaceable batteries, and/or rechargeable batteries. The power supply 14 may also include an AC adapter, so that the device may be plugged into a wall outlet. In fact, the power supply 14 may also include a DC adapter, so that the device 10 may be plugged into a source of DC power such as the cigarette lighter receptacle in a vehicle.

Various other devices may be coupled to the processor 12, depending upon the functions that the device 10 performs. For instance, an input device 16 may be coupled to the processor 12. The input device 16 may include any type of device that allows a user to issue commands to the device 10. Examples of typical input devices include buttons, switches, a keyboard, a light pen, a mouse, and/or a voice recognition system. A display 18 may also be coupled to the processor 12. The display 18 may include an LCD display, a CRT, LEDs, and/or an audio speaker. A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store the programming and other data. For instance, the processor 12 may be coupled to volatile memory 26, which may include dynamic random access memory (DRAM), static random access memory (SRAM), etc. The processor 12 may also be coupled to non-volatile memory 28. The non-volatile memory 28 may include a read-only memory (ROM), such as an EPROM or flash Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

A system clock 30 may be connected to one or more of the components of the device 10. The connections between the system clock and other devices are not shown in FIG. 1 for purposes of clarity. The details of the connections between the system clock 30 and other components of the device 10 are not believed to be crucial aspects of the present invention. Examples of components within the device 10 that may be connected to the system clock 30 include the processor 12, the non-volatile memory 28 and the volatile memory 26.

The processor 12, the non-volatile memory 28 and the volatile memory 26 may be implemented as one or more integrated circuit components. Also, the processor 12, the non-volatile memory 28 and the volatile memory 26 are examples of integrated circuit components that may include embodiments of input buffer circuits according to the present invention.

Figure 2:
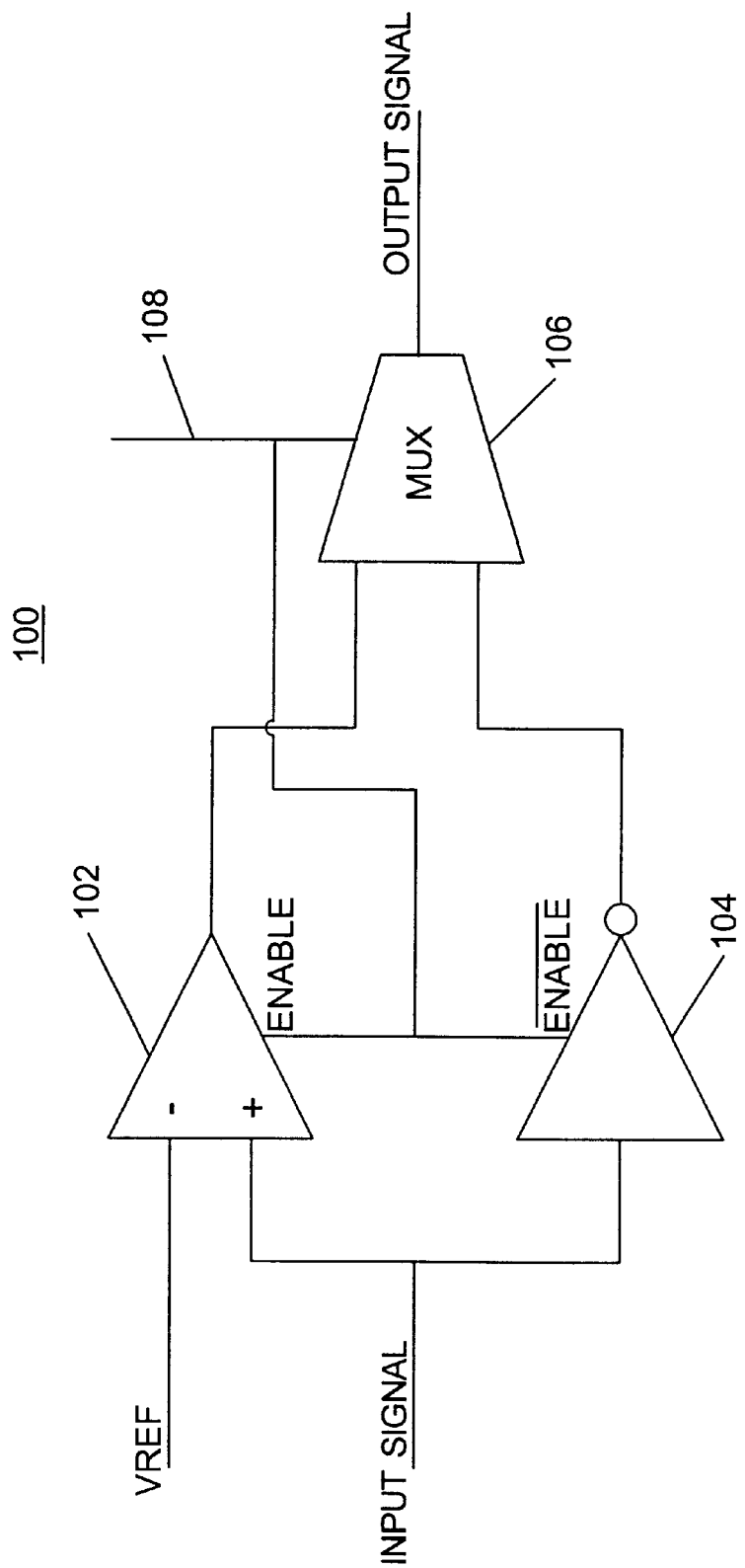
FIG. 2 is a block diagram of an embodiment of an input buffer circuit of the present invention.

FIG. 2 is a block diagram of an embodiment of an input buffer circuit of the present invention. The input buffer circuit is generally referred to by the reference numeral 100. The input buffer circuit 100 includes a differential input buffer 102 and a CMOS input buffer 104. The differential input buffer includes a reference voltage input, which is labeled $V_{REF}$ in FIG. 2. An input signal is provided to one input of the differential input buffer 102 and to the CMOS input buffer 104.

In the embodiment illustrated in FIG. 2, the CMOS input buffer 104 is an inverting buffer. The differential input buffer 102 and/or the CMOS input buffer 104 may be inverting or non-inverting as a matter of design choice. The status of either buffer as a non-inverting buffer or an inverting buffer is not a crucial aspect of the invention.

The outputs of the differential input buffer 102 and the CMOS input buffer 104 are both provided to a multiplexer 106. The multiplexer 106 provides an output signal, which is either the signal received from the differential input buffer 102 or the signal received from the CMOS input buffer 104. As described below, the input buffer which the multiplexer 106 selects to deliver as its output signal depends on the application of the integrated circuit in which the input buffer circuit 100 is implemented.

The designer of an electronic device that will employ the input buffer circuit 100 has the option to select one of the input buffers (the differential input buffer 102 or the CMOS input buffer 104) based on the design goals that are applicable to the electronic device. For example, if the designer is working on an electronic device that has low power consumption as an important design goal, the designer may choose to have the output of the CMOS input buffer 104 delivered as the output signal of the multiplexer 106. Using the CMOS input buffer 104 instead of the differential input buffer 102 will result in lower power consumption by the integrated circuit in which the input buffer circuit 100 is implemented. Alternatively, the designer may choose for the multiplexer 106 to deliver the output of the differential input buffer 102 if the intended application has higher performance as a design goal instead of low power consumption. The input buffer that is not selected will not be used. Those of ordinary skill in the art will appreciate that there is no need to connect a reference voltage $V_{REF}$ to the integrated circuit device in with the input buffer circuit 100 is implemented if none of the device inputs employ the differential input buffer.

A selector input 108 is connected to the multiplexer 106. The selector input determines which of the inputs to the multiplexer 106 is passed through as the output signal. In the embodiment illustrated in FIG. 2, the selector input 108 controls whether the output of the differential input buffer 102 or the output of the CMOS input buffer 104 is passed through and delivered as the output signal from the multiplexer 106. Power may be conserved by using the selector input 108 to select the input buffer that is appropriate for a given application. For example, if the selector input 108 is set to a logic low level, the multiplexer 106 may deliver the output of the differential input driver 102 as the output of the multiplexer 106. If the selector input 108 is set to a high logic level, the multiplexer 106 may deliver the output of the CMOS input driver 104 as the output of the multiplexer 106.

The specific logic levels given are matters of design choice and not believed to be crucial aspects of the invention.

As illustrated in FIG. 2, the selector input 108 may be used to enable either the differential input buffer 102 or the CMOS input buffer 104. Power is conserved because the enable logic of the two input buffers is complimentary. Only one of the buffers is enabled at a time.

The selector input 108 may be received as an actual input signal from an integrated circuit component or other source. Additionally, the selector input 108 may be programmed in software or implemented as a control register or the like. The specific implementation details of the selector input 108 are not believed to be crucial aspects of the present invention.

The actual selection of which input buffer to use may be implemented as part of an initialization routine of the integrated circuit device that contains the input buffer circuit 100. For example, if the input buffer circuit 100 is implemented in a DRAM memory device, the buffer selection may be made as part of a load mode initialization process. The selection of input buffer may typically be fixed for a given device in a specific application. For example, an implementation in which the CMOS input buffer 104 is the desired buffer may typically be set up so that the CMOS input buffer 104 is selected every time the device is initialized. Nevertheless, the choice of which input buffer (CMOS or differential) to use may be changed for a given input if such a change is necessary or desirable.

The choice of input buffer type may be made separately for individual input pins on the integrated circuit device in which the input buffer circuit 100 is implemented. In other words, some input pins may have the differential input buffer 102 enabled while other input pins on the same integrated circuit may have the CMOS input buffer 104 enabled. A separate input buffer circuit may be implemented for each input pin.

Figure 3:
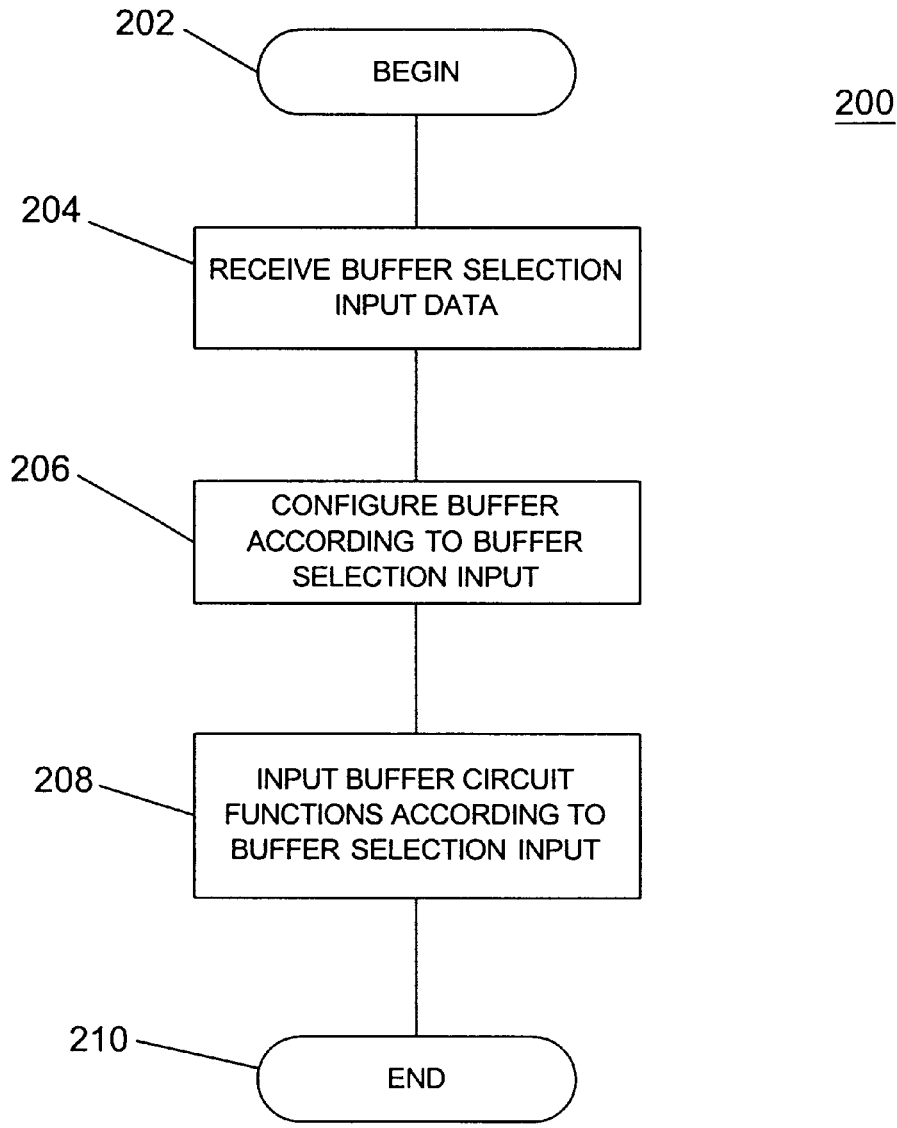
FIG. 3 is a process flow diagram showing the operation of an embodiment of the input buffer circuit of the present invention.

FIG. 3 is a process flow diagram showing the operation of an embodiment of the input buffer circuit. The process is generally referred to by the reference numeral 200. At block 202, the process begins. The process 200 generally relates to the configuration of input buffer circuits according to the present invention that are implemented in an integrated circuit. The integrated circuit may be one of a plurality of integrated circuits that comprise an electronic device.

The beginning of the process may occur when an electronic device containing an integrated circuit that incorporates an embodiment of the input buffer circuit of the present invention is turned on or initialized. The beginning of the process may additionally correspond to the entry into an initialization mode (such as a load mode process) by the integrated circuit device in which the embodiment of the input buffer circuit is implemented. The selection of a buffer described below may take place as part of the initialization mode or process.

At block 204, an input buffer circuit receives buffer selection input data. The buffer selection input data may be in the form of an input signal or data from a register or any other means or method of providing data on which the selection of a specific buffer configuration may be determined. The buffer selection input data may be applicable to one or more input buffer circuits on an integrated circuit device. In other words, the buffer selection input data may contain information that will be used to configure input buffer circuits for one or more input pins of a given integrated circuit device.

Configuration of input buffer circuits takes place at block 206. During the configuration, the input buffer circuits are placed in a mode that supports operation of the input buffer circuit in accordance with the buffer selection input data. For example, the logic level that corresponds to the selected type of input buffer (differential input buffer or CMOS input buffer) may be provided to the selector input 108 (FIG. 2) during the configuration process. At 208, the input buffer circuits configured at block 206 function according to the buffer selection input data.

At block 210, the process 200 ends. The ending of the process may occur when the electronic device or the integrated circuit in which the input buffer circuit 100 (FIG. 2) is implemented is turned off or placed in a new initialization state.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An input buffer circuit, comprising:
   a first input buffer comprising a first operational characteristic;
   a second input buffer comprising a second operational characteristic; and
   circuitry adapted to select the first input buffer or the second input buffer for operation in an integrated circuit device responsive to buffer selection input data provided as part of an initialization process of the integrated circuit device.

2. The input buffer circuit of claim 1 wherein the first operational characteristic comprises operation as a differential input buffer.

3. The input buffer circuit of claim 1 wherein the second operational characteristic comprises operation as a CMOS input buffer.

4. The input buffer circuit of claim 1 wherein the circuitry adapted to select the first input buffer or the second input buffer comprises a multiplexer that is adapted to receive the buffer selection input data.

5. The input buffer circuit of claim 4 wherein the multiplexer is adapted to:
   receive output from the first input buffer and output from the second input buffer; and
   provide either the output from the first input buffer or the output from the second input buffer as the output of the multiplexer responsive to the buffer selection input data.

6. The input buffer circuit of claim 1 wherein the input buffer circuit is implemented in a dynamic random access memory (DRAM) device.

7. The input buffer circuit of claim 1 wherein the initialization process is a load mode process.

8. An input buffer circuit, comprising:
   a differential input buffer;
   a CMOS input buffer; and
   circuitry adapted to select the differential input buffer or the CMOS input buffer for operation in an integrated circuit device responsive to buffer selection input data provided as part of an initialization process of the integrated circuit device.

9. The input buffer circuit of claim 8 the circuitry adapted to select the differential input buffer or the CMOS input buffer comprises a multiplexer that is adapted to receive the buffer selection input data.

10. The input buffer circuit of claim 9 wherein the multiplexer is adapted to:
    receive output from the differential input buffer and output from the CMOS input buffer; and provide either the output from the differential input buffer or the output from the CMOS input buffer as the output of the multiplexer responsive to the buffer selection input data.

11. The input buffer circuit of claim 8 wherein the input buffer circuit is implemented in a dynamic random access memory (DRAM) device.

12. The input buffer circuit of claim 8 wherein the initialization process is a load mode process.

13. An input buffer circuit, comprising:
a first input buffer comprising a first operational characteristic;
a second input buffer comprising a second operational characteristic;
means for receiving buffer selection input data; and
means for selecting the first input buffer or the second input buffer for operation in an integrated circuit device responsive to the buffer selection input data provided as part of an initialization process of the integrated circuit device.

14. The input buffer circuit of claim 13 wherein the first operational characteristic comprises operation as a differential input buffer.

15. The input buffer circuit of claim 13 wherein the second operational characteristic comprises operation as a CMOS input buffer.

16. The input buffer circuit of claim 13 wherein the means for selecting the first input buffer or the second input buffer comprises a multiplexer that is adapted to receive the buffer selection input data.

17. The input buffer circuit of claim 16 wherein the multiplexer is adapted to:
receive output from the first input buffer and output from the second input buffer; and
provide either the output from the first input buffer or the output from the second input buffer as the output of the multiplexer responsive to the buffer selection input data.

18. The input buffer circuit of claim 13 wherein the input buffer circuit is implemented in a dynamic random access memory (DRAM) device.

19. The input buffer circuit of claim 13 wherein the initialization process is a load mode process.

20. An input buffer circuit, comprising:
means for operating as a differential input buffer;
means for operating as a CMOS input buffer;
means for receiving buffer selection input data; and
means for selecting the means for operating as the differential input buffer or the means for operating as the CMOS input buffer for operation in an integrated circuit device responsive to the buffer selection input data provided as part of an initialization process of the integrated circuit device.

21. The input buffer circuit of claim 20 wherein the means for selecting comprises a multiplexer adapted to receive the buffer selection input data.

22. The input buffer circuit of claim 21 wherein the multiplexer is adapted to:
receive output from the means for operating as a differential input buffer and output from the means for operating as a CMOS input buffer; and
provide either the output from the means for operating as a differential input buffer or the output from the means for operating as a CMOS input buffer as the output of the multiplexer responsive to the buffer selection input data.

23. The input buffer circuit of claim 20 wherein the input buffer circuit is implemented in a dynamic random access memory (DRAM) device.

24. The input buffer circuit of claim 20 wherein the initialization process is a load mode process.

25. An electronic device, comprising:
a processor;
a power supply adapted to provide power to the processor;
a user input device that receives input from a user and provides the input to the processor;
a display device adapted to display information; and
a volatile memory device that comprises an input buffer circuit, the input buffer circuit comprising:
a first input buffer that comprises a first operational characteristic;
a second input buffer that comprises a second operational characteristic; and
circuitry adapted to select the first input buffer or the second input buffer responsive to buffer selection input data.

26. The electronic device of claim 25 wherein the first operational characteristic comprises operation as a differential input buffer.

27. The electronic device of claim 25 wherein the second operational characteristic comprises operation as a CMOS input buffer.

28. The electronic device of claim 25 wherein the circuitry that is adapted to select the first input buffer or the second input buffer comprises a multiplexer that is adapted to receive the buffer selection input data.

29. The electronic device of claim 28 wherein the volatile memory device is a dynamic random access memory (DRAM) device.

30. The electronic device of claim 25 wherein the multiplexer is adapted to:
receive output from the first input buffer and output from the second input buffer; and
provide either the output from the first input buffer or the output from the second input buffer as the output of the multiplexer responsive to the buffer selection input data.

31. The electronic device of claim 25 wherein the buffer selection input data is provided as part of an initialization process of the volatile memory device.

32. The electronic device of claim 31, wherein the initialization process is a load mode process.

33. An electronic device, comprising:
a processor;
a power supply adapted to provide power to the processor;
a user input device that receives input from a user and provides the input to the processor;
a display device adapted to display information; and
a volatile memory device that comprises an input buffer circuit, the input buffer circuit comprising:
a differential input buffer;
a CMOS input buffer; and
circuitry that is adapted to select the differential input buffer or the CMOS input buffer for operation in the integrated circuit device responsive to buffer selection input data.

34. The electronic device of claim 33 wherein the circuitry that is adapted to select the differential input buffer or the CMOS input buffer comprises a multiplexer that is adapted to receive the buffer selection input data.

35. The electronic device of claim 34 wherein the multiplexer is adapted to:
receive output from the differential input buffer and output from the CMOS input buffer; and
provide either the output from the differential input buffer or the output from the CMOS input buffer as the output of the multiplexer responsive to the buffer selection input data.

36. The electronic device of claim 33 wherein the volatile memory device is a dynamic random access memory (DRAM) device.

37. The electronic device of claim 36 wherein the buffer selection input data is provided as part of an initialization process of the volatile memory device.

38. The electronic device of claim 37 wherein the initialization process is a load mode process.

39. A method of operating an input buffer circuit, comprising the acts of:

receiving buffer selection data input as part of an initialization routine of an integrated circuit;

configuring an input buffer circuit in response to the buffer selection input data; and providing a selectable function that corresponds to the buffer selection data input.

40. The method of operating an input buffer circuit of claim 39 wherein the input buffer circuit includes a first input buffer and a second input buffer, the act of configuring the input buffer circuit comprising selecting between the first input buffer and the second input buffer.

41. The method of operating an input buffer circuit of claim 40, the act of providing a selectable function comprising providing a buffer output from either the first input buffer or the second input buffer depending on which is selected.

42. The method of operating an input buffer circuit of claim 40 wherein at least one of the first input buffer and the second input buffer is a differential input buffer.

43. The method of operating an input buffer circuit of claim 40 wherein at least one of the first input buffer and the second input buffer is a CMOS input buffer.

44. The method of operating an input buffer circuit of claim 40 wherein the first input buffer is a differential input buffer and the second input buffer is a CMOS input buffer.

45. The method of operating an input buffer circuit of claim 39 wherein the integrated circuit is a dynamic random access memory (DRAM) device.

46. The method of operating an input buffer circuit of claim 39 wherein the initialization routine is a load mode process.

* * * * *

UNITED STATES PATENT AND TRADEMARK OFFICE
CERTIFICATE OF CORRECTION

PATENT NO.     : 6,756,815 B2                                              Page 1 of 1
DATED          : June 29, 2004
INVENTOR(S)    : Scott Van De Graaff It is certified that error appears in the above-identified patent and that said Letters Patent is hereby corrected as shown below:

Title page,
Item [73], Assignee, should read:
-- Micron Technology, Inc., Boise, ID (U.S.) --

Signed and Sealed this

Twenty-first Day of September, 2004

JON W. DUDAS
*Director of the United States Patent and Trademark Office*